United States Patent [19]
Stapelbroek et al.

[11] Patent Number: 4,962,304
[45] Date of Patent: Oct. 9, 1990

[54] INTRINSIC IMPURITY BAND CONDUCTION DETECTORS

[75] Inventors: Maryn G. Stapelbroek, Santa Ana; Michael D. Petroff, Fullerton; Ramasesha Bharat, Orange, all of Calif.

[73] Assignee: Rockwell International Corporation, El Segundo, Calif.

[21] Appl. No.: 289,133

[22] Filed: Dec. 23, 1988

[51] Int. Cl.⁵ .................. H01J 40/14; H01L 29/12
[52] U.S. Cl. .................. 250/211 J; 357/58; 357/30
[58] Field of Search .......... 357/30 A, 58, 30 C, 357/30 R, 30 P; 250/211 J, 226, 338.4

[56] References Cited

U.S. PATENT DOCUMENTS

| | | | |
|---|---|---|---|
| 4,142,198 | 2/1979 | Finnila et al. | 250/338.4 |
| 4,488,038 | 12/1984 | Harrison et al. | 250/211 J |
| 4,488,165 | 12/1984 | Levine | 357/30 |
| 4,568,960 | 2/1986 | Petroff et al. | 357/30 |
| 4,586,068 | 4/1986 | Petroff et al. | 357/30 |
| 4,586,074 | 4/1986 | Stapelbroek et al. | 357/38 |
| 4,616,242 | 10/1986 | Solomon et al. | 357/58 |
| 4,633,279 | 12/1986 | Hipwood | 357/58 |
| 4,757,210 | 7/1988 | Bharat et al. | 250/578 |
| 4,860,074 | 8/1989 | Overhauser et al. | 357/4 |

Primary Examiner—David C. Nelms
Assistant Examiner—Michael Messinger
Attorney, Agent, or Firm—John J. Deinken

[57] ABSTRACT

Electromagnetic energy is detected by providing an extrinsic impurity-band semiconducting region with a first conductivity type impurity concentration high enough to create an impurity energy band. An intrinsic semiconducting blocking region is provided with first and second conductivity type impurity concentrations which are low enough that substantially no charge transport occurs by an impurity conduction mechanism. An electrical potential is applied to the impurity-band and blocking regions to create an electric field across the regions, then the regions are exposed to electromagnetic energy to generate intrinsic charge carriers in the regions. The electrical current induced in the regions as a result of the intrinsic charge carrier generation is measured.

13 Claims, 2 Drawing Sheets

INTRINSIC IMPURITY BAND CONDUCTION DETECTORS

BACKGROUND OF THE INVENTION

This invention is concerned with the detection of electromagnetic radiation.

The state of the art of infrared (IR) detectors, which are utilized in many scientific, medical, industrial, and defense applications, was significantly advanced with the introduction of impurity band conduction (IBC) devices. IBC devices, such as the Blocked Impurity Band (BIB) detector (see Petroff, et al., U.S. Pat. No. 4,568,960) and the Solid State Photomultiplier or SSPM (see Petroff, et al., U.S. Pat. No. 4,586,068), were originally developed primarily for applications requiring long wavelength infrared (LWIR—approximately 5 to 30 micrometers) photon detection, which involves extrinsic photocarrier generation. BIB detectors exhibit improved performance compared to the extrinsic detectors which were previously known in the art. The high concentration of majority dopant atoms used in BIB detectors allows the fabrication of a thin detector with high quantum efficiency, reduced sensitivity to nuclear radiation, and none of the irregular electrical characteristics found in previous extrinsic photoconductor designs. The SSPM, whose design was based upon the improvements achieved by the BIB detector, is capable of continuously detecting single photons with wavelengths as long as 28 micrometers.

Impurity band conduction devices have thus made possible significant performance improvements in detector technology for the long wavelength infrared energy region of the spectrum. It would be particularly advantageous to extend this technology over the short wavelength portion of the electromagnetic spectrum, including near infrared, visible light, soft X-rays, and X-rays, i.e., radiation having wavelengths less than approximately 1 micron; at these wavelengths, the absorption of light in silicon occurs by an intrinsic mechanism.

SUMMARY OF THE INVENTION

Electromagnetic energy is detected by the generation of intrinsic charge carriers. This is accomplished by first providing an extrinsic impurity-band semiconducting region with a first conductivity type impurity concentration which is high enough to create an impurity energy band. An intrinsic semiconducting blocking region is provided with first and second conductivity type impurity concentrations which are low enough that substantially no charge transport occurs by an impurity conduction mechanism. An electrical potential is applied to the impurity-band and blocking regions to create an electric field across the regions, then the regions are exposed to electromagnetic energy to generate intrinsic charge carriers in the regions. Finally, the electrical current induced in the regions as a result of the intrinsic charge carrier generation is measured.

In a more particular embodiment, the electromagnetic energy is filtered to remove that portion of the energy which would activate an extrinsic response in the regions.

The impurity-band region may be implemented by providing an extrinsic impurity-band semiconducting region with either a donor or an acceptor impurity concentration which is high enough to create an impurity energy band, while the step of providing the blocking region involves providing an intrinsic semiconducting blocking region with donor and acceptor impurity concentrations which are low enough that substantially no charge transport occurs by an impurity conduction mechanism.

The blocking region may be an undoped intrinsic semiconducting region, while the step of providing the impurity-band region may be achieved by epitaxially depositing an extrinsic impurity-band semiconducting layer on a substrate with a first conductivity type impurity concentration which is high enough to create an impurity energy band and epitaxially depositing the intrinsic semiconducting blocking layer on the impurity-band layer with first and second conductivity type impurity concentrations which are low enough that substantially no charge transport occurs by an impurity conduction mechanism.

Another alternative embodiment includes the step of providing an extrinsic semiconducting buffered region positioned such that the impurity-band region is between the blocking region and the buffered region, the buffered region having a first conductivity type impurity concentration which is high enough to create an impurity energy band and a second conductivity type impurity concentration which is high enough that first conductivity type carriers injected into the buffered region recombine with ionized first conductivity type impurities. In this instance, the step of providing an impurity-band region involves providing an extrinsic impurity-band semiconducting region with a first conductivity type impurity concentration which is high enough to create an impurity energy band and a second conductivity type impurity concentration which is low enough that first conductivity type carriers photogenerated in the impurity-band region can drift through the impurity-band region without recombining with ionized first conductivity type impurities.

DESCRIPTION OF THE INVENTION

Impurity band conduction (IBC) devices, such as the Blocked Impurity Band (BIB) detector and the Solid State Photomultiplier (SSPM), were developed primarily for long wavelength infrared (LWIR) photon detection, which is accomplished by the extrinsic generation of photocarriers. This extrinsic mode of operation is achieved, in both the BIB detector and the SSPM, by doping an IR-active layer with a sufficiently high concentration of impurities to create an impurity energy band and by providing a blocking layer which contains a low concentration of impurities. When an IBC detector is exposed to incoming LWIR energy, a photon absorbed by a neutral donor in the IR-active layer produces a mobile ionized donor charge and a conduction band electron. An electric field applied across the device causes the electron to drift towards and through the blocking layer, after which it is collected by the positive electrode. The ionized donor charge drifts through the device in the opposite direction by hopping conduction and is collected in the substrate.

Operation of the BIB detector and the SSPM by means of such extrinsic effects involves, in n-type impurity band conduction devices, only electrons and ionized donor charges. Such a device, however, is also capable of responding to the generation of intrinsic carriers. It is an outstanding feature of this invention to provide a method of detection with impurity band conduction devices which utilizes an intrinsic response mechanism to detect short wavelength radiation, including near-IR, visible light, ultraviolet radiation, and soft x-rays.

Figure 1:
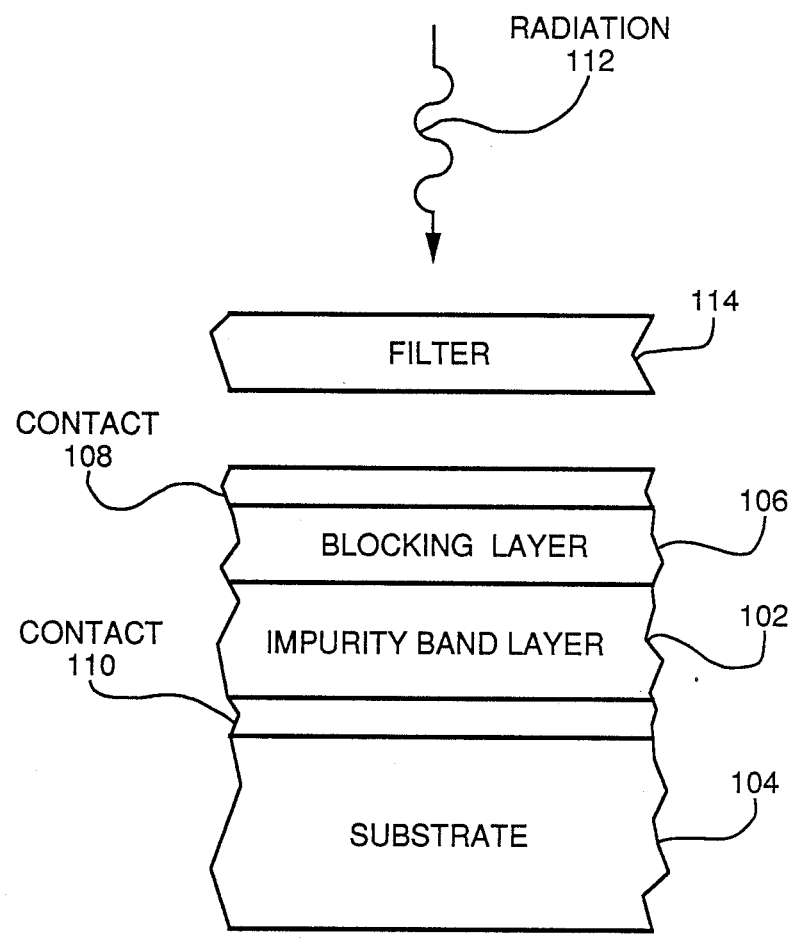
FIG. 1 is a cross sectional schematic view of a BIB detector constructed according to the present invention to respond to short wavelength radiation.

FIG. 1 is a cross sectional schematic view of a BIB detector which can be used according to the present invention to respond to short wavelength radiation. In this embodiment, an extrinsic impurity-band semiconducting layer 102 is deposited on a substrate 104, with an intrinsic semiconducting blocking layer 106 deposited on the impurity-band layer 102. The impurity-band and blocking layers are positioned between a first contact 108 and a second contact 110 so that an electrical potential applied to the contacts creates an electric field across the layers. These contacts, as will be appreciated by those skilled in the art, can take a variety of forms, including, for example, a degenerately doped region or an ion implanted region. The impurity-band layer 102 is provided with a first conductivity type impurity concentration high enough to create an impurity energy band. The blocking layer 106 contains first and second conductivity type impurity concentrations which are both low enough that substantially no charge transport can occur in the blocking layer by an impurity band conduction mechanism.

In the BIB detector of FIG. 1, intrinsic carriers (i.e., conduction band electrons and valence band holes) are induced in the impurity-band and blocking layers by incoming short wavelength radiation 112. Incoming long-wavelength infrared (LWIR) radiation is prevented from activating the extrinsic response of the detector by a cooled high-pass filter 114. As those skilled in the art will appreciate, the selectivity of the filter 114 can be adjusted according to the desired response of the detector. If, for example, only short wavelength excitation is desired, the filter should block all other IR radiation. At a low bias level, the electron is collected on the positive electrode 108 and either the valence band hole itself, or a D+ charge (a D+ charge, or impurity-band hole, is formed if the hole recombines with an electron on a neutral donor in the impurity-band layer), is collected at the substrate contact 110. At high bias operation, the electron or the hole can impact ionize neutral donors before being collected. This leads to the same type of avalanche gain as observed in the infrared response of BIB detectors at high bias levels.

Figure 2:
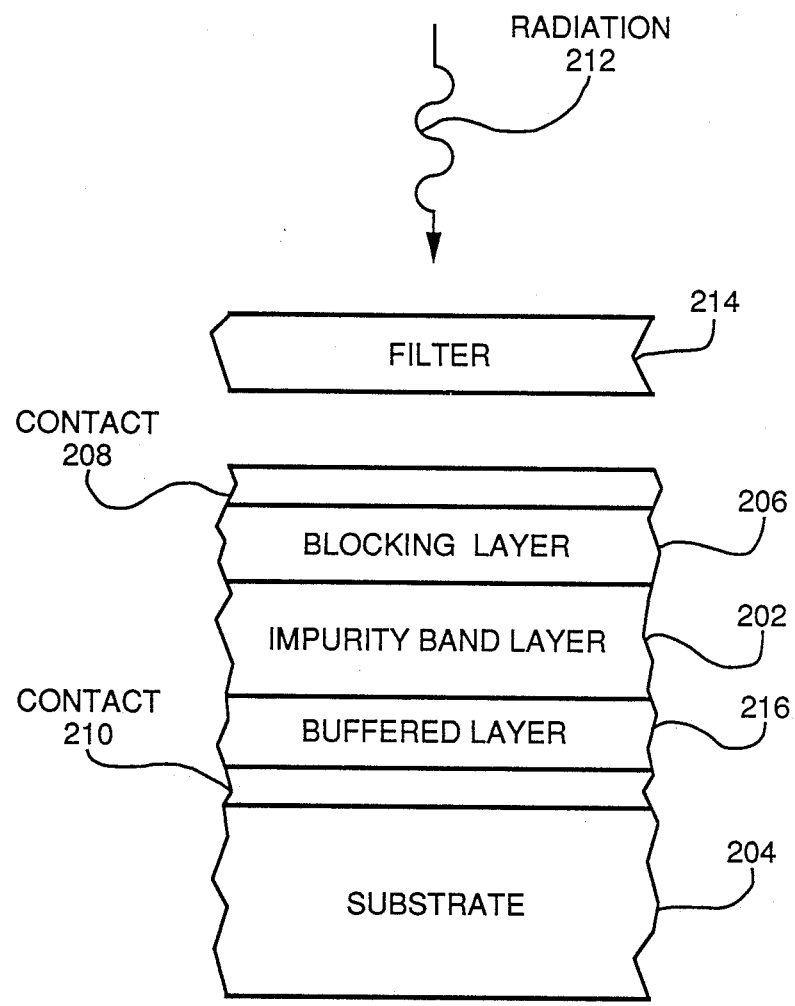
FIG. 2 is similar to FIG. 1, but illustrates an SSPM constructed according to the present invention to respond to short wavelength radiation.

FIG. 2 is similar to FIG. 1, but illustrates an SSPM which can be used in accordance with the present invention to respond to short wavelength radiation. Here, an extrinsic impurity-band semiconducting buffered layer 216 is deposited on a substrate 204. An extrinsic impurity-band semiconducting layer 202 is deposited on the buffered layer 216 and an intrinsic semiconducting blocking layer 206 is deposited on the impurity-band layer 202. The impurity-band, buffered, and blocking layers are positioned between a first contact 208 and a second contact 210 so that an electrical potential applied to the contacts creates an electric field across the layers. As with the embodiment illustrated in FIG. 1, intrinsic carriers are induced in the impurity-band and blocking layers by incoming short wavelength radiation 212. Incoming LWIR radiation may be prevented from activating the extrinsic response of the detector by a cooled high-pass filter 214.

Intrinsic carrier generation occurs in both the blocking layer and impurity-band layer of an SSPM for short wavelength photons. Photoelectrons created by photons absorbed deep in the impurity-band layer lead to the same kind of avalanche effect as that caused by LWIR photon-generated photoelectrons. In an SSPM, the electric field in the region of the impurity-band layer near the blocking layer is high enough that, for every hole generated in the blocking layer or in the high-field part of the impurity-band layer (gain region), at least one free electron is generated by impact ionization of a neutral donor by the hole deep enough in the IR layer to cause a full sized avalanche. Thus, when a short wavelength photon is absorbed in the blocking layer or gain region, creating a hole-electron pair, there is a high probability that it will also produce an output current pulse. If an antireflective coating is used, the quantum efficiency of an SSPM in the short wavelength light region can approach 100%.

The differences between the intrinsic mechanism operating in response to short wavelength excitation and the extrinsic response to IR radiation imply some differences in structure for an optimal intrinsic SSPM. Since an SSPM for detecting short wavelength light does not need to have the thick layer of impurity band conduction material required in an LWIR SSPM, only about six micrometers of avalanche gain region will suffice to ensure a full sized avalanche. In qualitative terms, the thickness of the impurity-band layer should be large enough to provide an avalanche gain region but it should kept as small as possible in order to suppress dark pulses and reduce the recovery time of the areas affected by an avalanche.

The intrinsic IBC detection method of this invention can be used to detect radiation in the ultraviolet, vacuum ultraviolet, soft x-ray, and x-ray regions of the electromagnetic spectrum, as will be appreciated by those skilled in the art, either by the direct intrinsic mechanism for carrier generation or indirectly by inserting a phosphor material between the detector and the incoming radiation to downconvert the radiation of the desired wavelength into short wavelength light, which is then detected by the direct intrinsic mechanism in the detector. In order to extend the direct response beyond the visible to the ultraviolet, the first contact must be made thinner than for an IBC detector optimized for infrared response. Good ultraviolet response at a wavelength of about 0.3 micrometers may be possible with n+ contacts several hundred angstroms thick, while shorter wavelengths can be detected with reduced quantum efficiency.

The preferred embodiments of this invention have been illustrated and described above, showing how BIB and SSPM detection techniques can be adapted to efficiently detect near-infrared energy, ultraviolet, visible light, soft X-rays, and X-rays to about 100 KeV. Modifications and additional embodiments, however, will undoubtedly be apparent to those skilled in the art. FIGS. 1 and 2, for example, depict frontside illuminated embodiments which can be used to practice the invention. A number of other configurations, such as backside illumination and transverse illumination, can be used as well in the detection method of this invention. These embodiments are described in detail in U.S. Pat. Nos. 4,568,960; 4,586,068; and 4,586,074 as well as Bharat, et al., U.S. patent application Ser. No. 020,418, filed Mar. 2, 1987. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

The teaching of the following documents, which are referred to herein, is incorporated by reference: Petroff, et al., U.S. Pat. No. 4,568,960; Petroff, et al., U.S. Pat. No. 4,586,068; Stapelbroek, et al., U.S. Pat. No. 4,586,074; and Bharat, et al., U.S. patent application No. 020,418, filed Mar. 2, 1987.

We claim:

1. A method of detecting electromagnetic energy by the generation of intrinsic charge carriers, comprising the steps of:
   providing an extrinsic impurity-band semiconducting region with a first conductivity type impurity concentration which is high enough to create an impurity energy band;
   providing an intrinsic semiconducting blocking region with first and second conductivity type impurity concentrations which are low enough that substantially no charge transport occurs by an impurity conduction mechanism;
   applying an electrical potential to the impurity-band and blocking regions to create an electric field across the regions;
   exposing the regions to the electromagnetic energy to generate intrinsic charge carriers in the regions; and
   sensing the electrical current induced in the regions as a result of the intrinsic charge carrier generation.

2. The method of claim 1, further comprising, prior to the step of exposing the regions to the electromagnetic energy, the step of filtering the electromagnetic energy to remove that portion of the energy which would activate an extrinsic response in the regions.

3. The method of claim 1, wherein the step of providing the impurity-band region further comprises:
   providing an extrinsic impurity-band semiconducting region with a donor impurity concentration which is high enough to create an impurity energy band;
   and wherein the step of providing the blocking region further comprises:
   providing an intrinsic semiconducting blocking region with donor and acceptor impurity concentrations which are low enough that substantially no charge transport occurs by an impurity conduction mechanism.

4. The method of claim 1, wherein the step of providing the impurity-band region further comprises:
   providing an extrinsic impurity-band semiconducting region with an acceptor impurity concentration which is high enough to create an impurity energy band;
   and wherein the step of providing the blocking region further comprises:
   providing an intrinsic semiconducting blocking region with donor and acceptor impurity concentrations which are low enough that substantially no charge transport occurs by an impurity conduction mechanism.

5. The method of claim 1, wherein the step of providing the blocking region further comprises:
   providing an undoped intrinsic semiconducting blocking region.

6. The method of claim 1, wherein the step of providing the impurity-band region further comprises:
   epitaxially depositing an extrinsic impurity-band semiconducting layer on a substrate with a first conductivity type impurity concentration which is high enough to create an impurity energy band; and
   the step of providing the blocking region further comprises:
   epitaxially depositing an intrinsic semiconducting blocking layer on the impurity-band layer with first and second conductivity type impurity concentrations which are low enough that substantially no charge transport occurs by an impurity conduction mechanism.

7. The method of claim 1, further comprising the step of providing an extrinsic semiconducting buffered region positioned such that the impurity-band region is between the blocking region and the buffered region, the buffered region having a first conductivity type impurity concentration which is high enough to create an impurity energy band and a second conductivity type impurity concentration which is high enough that first conductivity type carriers injected into the buffered region recombine with ionized first conductivity type impurities;
   and wherein the step of providing an impurity-band region further comprises the step of:
   providing an extrinsic impurity-band semiconducting region with a first conductivity type impurity concentration which is high enough to create an impurity energy band and a second conductivity type impurity concentration which is low enough that first conductivity type carriers photogenerated in the impurity-band region can drift through the impurity-band region without recombining with ionized first conductivity type impurities.

8. A method of detecting electromagnetic energy by the generation of intrinsic charge carriers, comprising the steps of:
   providing an extrinsic semiconducting buffered region with a first conductivity type impurity concentration which is high enough to create an impurity energy band and with a second conductivity type impurity concentration which is high enough that first conductivity type carriers injected into the buffered region recombine with ionized first conductivity type impurities;
   providing an intrinsic semiconducting blocking region with first and second conductivity type impurity concentrations which are low enough that substantially no charge transport occurs by an impurity conduction mechanism;
   providing an extrinsic impurity-band semiconducting region between the blocking region and the buffered region with a first conductivity type impurity concentration which is high enough to create an impurity energy band and with a second conductivity type impurity concentration which is low enough that first conductivity type carriers photogenerated in the impurity-band region can drift through the impurity-band region without recombining with ionized first conductivity type impurities;

applying an electrical potential to the buffered, impurity-band, and blocking regions to create an electric field across the regions;

exposing the regions to the electromagnetic energy to generate intrinsic charge carriers in the regions; and sensing the electrical current induced in the regions as a result of the intrinsic charge carrier generation.

9. The method of claim 8, further comprising, prior to the step of exposing the regions to the electromagnetic energy, the step of filtering the electromagnetic energy to remove that portion of the energy which would activate an extrinsic response in the regions.

10. The method of claim 8, wherein the step of providing the buffered region further comprises:

providing an extrinsic semiconducting buffered region with a donor impurity concentration which is high enough to create an impurity energy band and with an acceptor impurity concentration which is high enough that donor carriers injected into the buffered region recombine with ionized donor impurities;

wherein the step of providing the blocking region further comprises:

providing an intrinsic semiconducting blocking region with donor and acceptor impurity concentrations which are low enough that substantially no charge transport occurs by an impurity conduction mechanism; and wherein the step of providing the impurity-band region further comprises:

providing an extrinsic impurity-band semiconducting region between the blocking region and the buffered region with a donor impurity concentration which is high enough to create an impurity energy band and with an acceptor impurity concentration which is low enough that donor carriers photogenerated in the impurity-band region can drift through the impurity-band region without recombining with ionized donor impurities.

11. The method of claim 8, wherein the step of providing the buffered region further comprises:

providing an extrinsic semiconducting buffered region with an acceptor impurity concentration which is high enough to create an impurity energy band and with a donor impurity concentration which is high enough that acceptor carriers injected into the buffered region recombine with ionized acceptor impurities;

wherein the step of providing the blocking region further comprises:

providing an intrinsic semiconducting blocking region with donor and acceptor impurity concentrations which are low enough that substantially no charge transport occurs by an impurity conduction mechanism; and wherein the step of providing the impurity-band region further comprises:

providing an extrinsic impurity-band semiconducting region between the blocking region and the buffered region with an acceptor impurity concentration which is high enough to create an impurity energy band and with a donor impurity concentration which is low enough that acceptor carriers photogenerated in the impurity-band region can drift through the impurity-band region without recombining with ionized acceptor impurities.

12. The method of claim 8, wherein the step of providing the blocking region further comprises providing an undoped intrinsic semiconducting blocking region.

13. The method of claim 8, wherein the step of providing the buffered region further comprises:

epitaxially depositing an extrinsic semiconducting buffered layer on a substrate with a first conductivity type impurity concentration which is high enough to create an impurity energy band and with a second conductivity type impurity concentration which is high enough that first conductivity type carriers injected into the buffered layer recombine with ionized first conductivity type impurities;

wherein the step of providing the impurity-band region further comprises:

epitaxially depositing an extrinsic impurity-band semiconducting layer on the buffered layer with a first conductivity type impurity concentration which is high enough to create an impurity energy band and with a second conductivity type impurity concentration which is low enough that first conductivity type carriers photogenerated in the impurity-band layer can drift through the impurity-band layer without recombining with ionized first conductivity type impurities; and wherein the step of providing the blocking region further comprises:

epitaxially depositing an intrinsic semiconducting blocking layer on the impurity-band layer with first and second conductivity type impurity concentrations which are low enough that substantially no charge transport occurs by an impurity conduction mechanism.

* * * * *